United States Patent
Huang et al.

(10) Patent No.: US 10,355,321 B2
(45) Date of Patent: Jul. 16, 2019

(54) METHOD AND DEVICE FOR DETECTING STATES OF BATTERY AND BATTERY PACK

(71) Applicant: Silergy Semiconductor Technology (Hangzhou) Ltd., Hangzhou (CN)

(72) Inventors: Xiaodong Huang, Hangzhou (CN); Zhaofeng Wang, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 71 days.

(21) Appl. No.: 15/631,118

(22) Filed: Jun. 23, 2017

(65) Prior Publication Data
US 2017/0373354 A1    Dec. 28, 2017

(30) Foreign Application Priority Data

Jun. 23, 2016   (CN) .......................... 2016 1 0478761

(51) Int. Cl.
*H02J 7/00* (2006.01)
*H01M 10/48* (2006.01)
(Continued)

(52) U.S. Cl.
CPC ........ *H01M 10/48* (2013.01); *G01R 19/0069* (2013.01); *G01R 31/364* (2019.01);
(Continued)

(58) Field of Classification Search
CPC ............... Y02E 60/12; G01R 31/3648; G01R 31/3651; G01R 31/3624; H02J 7/0047
(Continued)

(56) References Cited

U.S. PATENT DOCUMENTS

| | | | |
|---|---|---|---|
| 7,557,584 B2 * | 7/2009 | Murakami | G01R 31/3624 320/132 |
| 2004/0032264 A1 * | 2/2004 | Schoch | G01R 31/361 324/426 |
| 2009/0085520 A1 * | 4/2009 | Murao | H02J 7/0014 320/134 |

FOREIGN PATENT DOCUMENTS

| | | |
|---|---|---|
| CN | 101359036 A | 2/2009 |
| CN | 102496970 B | 5/2014 |

(Continued)

OTHER PUBLICATIONS

Office Action for Chinese Patent Application No. 201610478761.7, dated Mar. 5, 2018, 10 pages.

*Primary Examiner* — Arun C Williams
(74) *Attorney, Agent, or Firm* — Westman, Champlin & Koehler, P.A.

(57) ABSTRACT

Disclosed is a method and a device for detecting states of a battery and a battery pack. The disclosure obtains a first state of charge and a second state of charge of the battery by use of a charge calculation method and a method based on battery model, respectively. The charge calculation method is more accurate when the charge-discharge current is large and the method based on battery model performs better in handling a small current, so that a chemistry state of charge obtained by performing a weighted calculation for the first state of charge and the second state of charge can represent the real state of charge of the battery more precisely. The disclosure settles the difficulty on parameter extraction of the conventional model method, eliminates the influence of the accumulated error of the charge calculation method, and combines the advantages of the method based on the battery model and the coulometer method.

13 Claims, 5 Drawing Sheets

(51) Int. Cl.
*G01R 31/364* (2019.01)
*G01R 19/00* (2006.01)
*H01M 2/20* (2006.01)
*H01M 10/42* (2006.01)
*H01M 10/44* (2006.01)

(52) U.S. Cl.
CPC ....... *H01M 2/202* (2013.01); *H01M 10/4285* (2013.01); *H01M 10/446* (2013.01)

(58) Field of Classification Search
USPC .......................................................... 320/132
See application file for complete search history.

(56) References Cited

FOREIGN PATENT DOCUMENTS

| | | |
|---|---|---|
| CN | 104360285 A | 2/2015 |
| CN | 105403839 A | 3/2016 |
| CN | 106199434 A | 12/2016 |

\* cited by examiner

METHOD AND DEVICE FOR DETECTING STATES OF BATTERY AND BATTERY PACK

CROSS-REFERENCE TO RELATED APPLICATION

This application claims the benefit of Chinese Patent Application No. 201610478761.7, filed on Jun. 23, 2016, which is incorporated herein by reference in its entirety.

BACKGROUND OF THE DISCLOSURE

Field of the Disclosure

The disclosure relates to a technology of power supply management, and more particularly, to a method and a device for detecting states of a battery and a battery pack.

Background of the Disclosure

State detection of a battery is critical to power management for portable terminals or outdoor devices. For example, in some of the prior arts, state of charge of a battery, also known as SOC, is detected by a method that defines several voltage ranges for battery terminal voltage and obtains the state of charge of the battery in accordance with the voltage range where the battery terminal voltage locates. An advantage of the method is that the structure can be simple, but the method can only provides a rough determination of the battery power and the error is very large when the charge current or discharge current of the battery is very large. Accordingly, there is a need for a method and a device, which are more accurate and applicable, for state detection of a battery and a battery pack.

SUMMARY OF THE DISCLOSURE

In view of the above, the disclosure provides a method and a device for accurate state detection of a battery and a battery pack.

According to a first aspect of the disclosure, there is provided a method for detecting a state of a battery, comprising:

obtaining a first state of charge by use of a charge calculation method, and obtaining a second state of charge in accordance with a battery model and a relationship between open circuit voltage and state of charge; and performing a weighted calculation for the first state of charge and the second state of charge to obtain a chemistry state of charge.

Preferably, weight values used in the weighted calculation varies with a present charge-discharge current of the battery.

Preferably, a first weight value corresponding to the first state of charge decreases as the charge-discharge current decreases, and a second weight value corresponding to the second state of charge increases as the charge-discharge current decreases.

Preferably, the step of obtaining a first state of charge by use of a charge calculation method comprises:

detecting a charge-discharge current and a charge-discharge duration time of the battery;

obtaining a present maximum charge amount and an initial charge amount of present charge-discharge process; and calculating the first state of charge in accordance with the maximum charge amount, the initial charge amount of present charge-discharge process, the charge-discharge current and the charge-discharge duration time of the battery.

Preferably, the present maximum charge amount is obtained by updating a changing value of a charge amount and a changing value of a state of charge in a previous charge-discharge process, the changing value of the state of charge is a changing value in the previous charge-discharge process of the first state of charge or of the second state of charge or of the chemistry state of charge.

Preferably, the present maximum charge amount is updated in a case that the changing value of the state of charge in a charge process or in a discharge process is greater than a predetermined threshold value, or, the present maximum charge amount is updated in a case that the changing value of the state of charge accumulated in a plurality of charge processes is greater than a predetermined threshold value or in a case that the changing value of the state of charge accumulated in a plurality of discharge processes is greater than a predetermined threshold value.

Preferably, the initial charge amount of present charge-discharge process is calculated based on the present maximum charge amount and the initial state of charge of present charge-discharge process, and the initial state of charge of present charge-discharge process is the first state of charge or the second state of charge or the chemistry state of charge obtained after previous charge-discharge process.

Preferably, the step of obtaining a second state of charge in accordance with a battery model and a relationship between open circuit voltage and state of charge comprises:

obtaining a present open circuit voltage (OCV) of the battery in accordance with a battery internal resistance, a battery terminal voltage and a present charge-discharge current of the battery, based on the battery model, and obtaining the second state of charge corresponding to the present open circuit voltage of the battery based on the relationship between open circuit voltage and state of charge.

Preferably, the battery internal resistance is updated periodically in accordance with an estimated open circuit voltage of the battery, the battery terminal voltage and the present charge-discharge current of the battery, the estimated battery open circuit voltage is obtained based on the relationship between open circuit voltage and state of charge, which corresponds to the present chemistry state of charge.

Preferably, the method further comprises:

calculating at least one of the following battery state parameters in accordance with the chemistry state of charge: a residual charge (RM), a relative state of charge (RSOC) and a remaining usable time (TTE) of the battery.

According to a second aspect of the disclosure, there is provided a method for detecting a state of a battery pack, wherein the battery pack comprises at least two batteries being coupled in series or in parallel, the method comprises:

obtaining a first state of charge of each battery by use of a charge calculation method, and obtaining a second state of charge of each battery in accordance with a battery model and a relationship between open circuit voltage and state of charge; and performing a weighted calculation for the first state of charge and the second state of charge of each battery to obtain a chemistry state of charge of each battery; and calculating a chemistry state of charge of the battery pack in accordance with the chemistry state of charge of each battery.

According to a third aspect of the disclosure, there is provided a method for detecting a state of a battery pack, wherein the battery pack comprises at least two batteries being coupled in series or parallel, the method comprises:

obtaining a first state of charge of the battery pack by use of a charge calculation method, and obtaining a second state of charge of the battery pack in accordance with a battery model and a relationship between open circuit voltage and state of charge; wherein an average terminal voltage of the batteries in the battery pack is used for calculating an open circuit voltage of a battery; and performing a weighted calculation for the first state of charge of the battery pack and the second state of charge of the battery pack to obtain a chemistry state of charge of the battery pack.

According to a fourth aspect of the disclosure, there is provided a device for detecting a state of a battery or a battery pack, comprising: a processor for performing the method according to one of the above methods.

The disclosure obtains a first state of charge and a second state of charge of the battery by use of the charge calculation method and a method based on battery model, respectively. The charge calculation method is more accurate when the charge-discharge current is large and the method based on battery model performs better in handling a small current, so that a chemistry state of charge obtained by performing a weighted calculation for the first state of charge and the second state of charge can represent the real state of charge of the battery more precisely. The disclosure settles the difficulty on parameter extraction of the conventional model method, eliminates the influence of the accumulated error of the charge calculation method, and combines the advantages of the method based on the battery model and the coulometer method.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Figure 1:
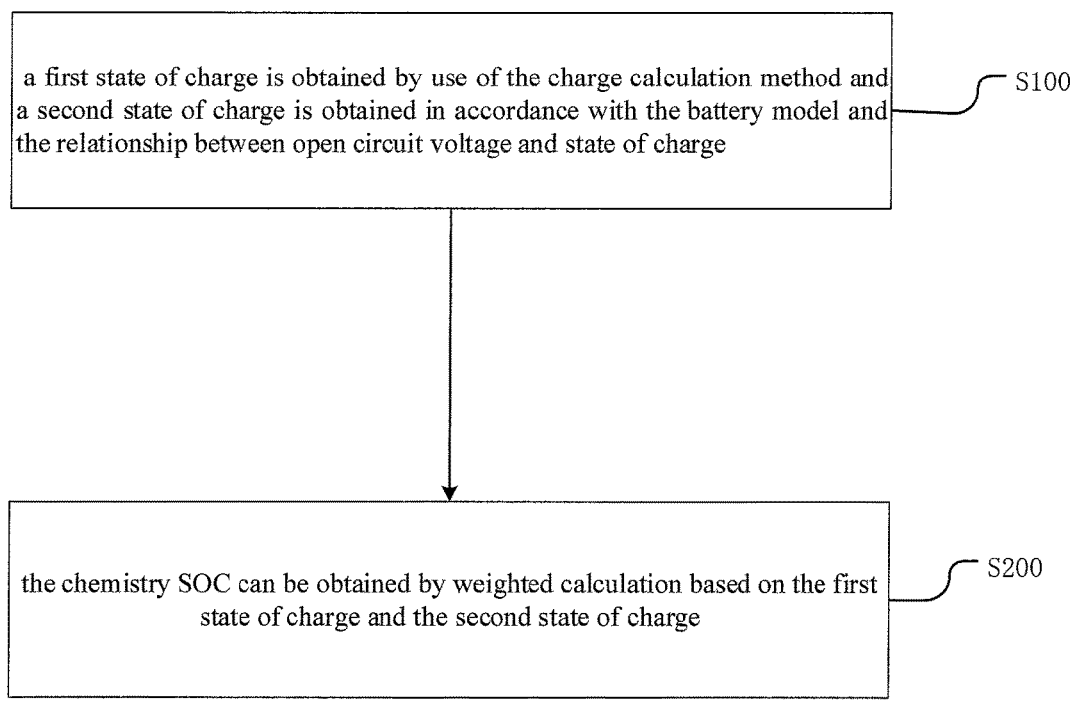
FIG. 1 is a flow diagram of an example method for detecting a state of a battery according to an embodiment of the present disclosure.

Reference will now be made in detail to particular embodiments of the disclosure, it will be understood that the scope of the present invention is not limited to these embodiments. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, and circuits have not been described in detail so as not to unnecessarily obscure aspects of the present invention.

Furthermore, it will be understood by one skilled in the art that attached drawings are to be regarded as illustrative, and may not be drawn to scale.

Also, it will be understood in the following description that the term "circuit" refers to a conductive loop consisting of at least one component or sub-circuit which are electrically connected or electromagnetically coupled to each other. When one component/circuit is referred to as being "connected to" another component, or one component/circuit is referred to as being "connected between" two nodes, it can be connected to or coupled to another component directly or with an intermediate component therebetween. The connection of two components can be physical or logical connection, or physical and logical connection. On the contrary, when one component is referred to as being "coupled directly to" or "connected directly to" another component, there will be no an intermediate component between two components.

On the contrary, when one component is referred to as being "coupled directly to" or "connected directly to" another component, there will be no intermediate component between two components.

In the following description that the terms such as "first", "second" and the like are used herein for purposes of description and are not intended to indicate or imply relative importance or significance. The term "plurality", as used herein, is defined as two or more than two, unless something otherwise is specifically stated.

The conventional technology can sample a charge-discharge current of a battery at real time and obtain a changing value of a charge amount of the battery by integrating, and then the state of charge of the battery is calculated based on the total charge amount of the battery and the changing value of the charge amount of the battery. The method is referred to as a charge calculation method or a coulometer method, which is highly accurate when the charge-discharge current is large. However, when the charge-discharge current is relatively small, an ammeter causes measurement errors which cannot be eliminated, and the measurement errors will be accumulated. Because there is a self-discharge phenomenon existing in the battery, where a self-discharge current is too small to be measured, this part of the power consumption cannot be calculated by the coulometer method.

On another hand, there is another method in the prior art, which constructs a battery model, calculates an open circuit voltage (OCV) of the battery based on the measurable battery parameters and the battery model, and then obtains a corresponding state of charge in accordance with a table or a curved line showing the SOC-OCV relationship (the relationship between the state of charge and the open circuit voltage). However, although there are various battery models for the open circuit voltage, simple models cannot completely represent the characteristics of the battery and complex models may has difficulty in application because many battery parameters need to be measured.

The disclosure settles the difficulty on parameter extraction of the conventional model method, eliminates the influence of the accumulated error of the charge calculation method, and combines the advantages of the method based on the battery model and the coulometer method.

FIG. 1 is a flow diagram of an example method for detecting a state of a battery according to an embodiment of the present disclosure. As shown in FIG. 1, the method comprises the following steps.

At step S100, a first state of charge is obtained by use of the charge calculation method and a second state of charge is obtained in accordance with the battery model and the relationship between open circuit voltage and state of charge.

It should be understood that the first state of charge and the second state of charge can be obtained in a predetermined order or simultaneously.

Specifically, the first state of charge can be obtained by the following steps.

At step 110, a charge-discharge current I of the battery is detected.

The changing value $\Delta Q$ of the charge amount in the charge-discharge duration time can be calculated by integrating the charge-discharge current I by the charge-discharge duration time $\Delta t$, and the changing value $\Delta Q$ of the charge amount can also be obtained by, for example, a charge amount calculation means such as a coulometer.

At step 120, a present maximum charge amount Qmax and an initial charge amount $Q_0$ of a present charge-discharge process are obtained.

At step 130, the first state of charge is calculated in accordance with the maximum charge amount Qmax, the initial charge amount $Q_0$ of the present charge-discharge process and the charge-discharge current I of the battery.

Specifically, the first state of charge can be obtained by a following equation.

$$SOC = \frac{Q_0 - \int idt}{Q_{max}},$$

that is, a remaining charge amount is obtained by subtracting the changing value $\Delta Q$ of the charge amount in the present charge-discharge process from the initial charge amount $Q_0$ of the present charge-discharge process, and then the state of charge is obtained by dividing the remaining charge amount by the present maximum charge amount (i.e., the total amount of charge which can be stored in the battery).

Preferably, the initial charge amount $Q_0$ of the present charge-discharge process can be obtained by the calculation based on the present maximum charge amount Qmax and the initial state of charge of the present charge-discharge process, that is, it can be obtained by Qmax*SOC (or a chemistry state of charge previously calculated). The initial state of charge of the present charge-discharge process can be the first state of charge or the second state of charge or the chemistry state of charge, which is obtained after the previous charge-discharge process.

In real application, the internal resistance of the battery gradually increases with the increase of charging and discharging times of the battery, which results in a decrease in the amount of the chargeable and releasable charges. Accordingly, the maximum charge amount Qmax will decrease with the increase of charging and discharging times of the battery. If the maximum charge amount Qmax obtained at the factory state of the battery is used all the time during the calculation, the state of charge obtained by the calculation will be smaller than its actual value and the error will increase gradually with the increase of charging and discharging times. In order to solve the above problems, it is preferred to update the maximum charge amount Qmax.

The present maximum charge amount Qmax is updated based on the changing value of the charge amount and the changing value of the chemistry state of charge in the previous charge-discharge process. The maximum charge amount Qmax can be updated by the following equation.

$$Q_{max} = \frac{\Delta Q}{\Delta SOC},$$

$\Delta Q$ is a changing value of the charge amount of the battery of the previous charge-discharge process, which is obtained by integrating the charge-discharge current I, or by accumulating through a coulometer. $\Delta SOC$ is a changing value of the battery state of charge in the charge-discharge process corresponding to $\Delta Q$, it may be a changing value of the first state of charge obtained by use of the charge calculation method or a changing value of the second state of charge by use of the model method or a changing value of the chemistry state of charge obtained after the present charge-discharge process. The previous charge-discharge process is referred to as the charge-discharge process that has been ended before the current time. Specifically, $\Delta Q$ may be the changing value of the charge amount of the battery in one or more previous charge processes, and accordingly, $\Delta SOC$ is the changing value of the state of charge in the charge processes corresponding to $\Delta Q$. Alternatively, $\Delta Q$ may also be the changing value of the charge amount of the battery in one or more previous discharge processes, and accordingly, $\Delta SOC$ is the changing value of the state of charge in the discharge processes corresponding to $\Delta Q$. $\Delta Q$ may also be the changing value of the charge amount of the battery in one or more previous charge-discharge processes, and accordingly, $\Delta SOC$ is the changing value of the state of charge in the charge-discharge processes corresponding to $\Delta Q$.

It is easily understood that it will be more accurate if the update of the present maximum charge amount Qmax is based on the changing value of the chemistry state of charge.

In order to reduce the cumulative error of the coulometer method, the present maximum charge amount can be updated when the accumulated value of the changing values of the state of charge in one or more charge processes is greater than the predetermined threshold value. Or, the present maximum charge amount is updated when the accumulated value of the changing values of the state of charge in one or more discharge processes is greater than the predetermined threshold value. The update is triggered only if the changing value of the state of charge in a single charge or in a single discharge process is greater than the predetermined threshold value, or the update can be triggered once the accumulated value of changing values of the state of charge is larger than the predetermined threshold value.

Thus, it is possible to avoid the inaccurate detection for the state of charge due to the decrease of the maximum charge amount Qmax as the increase of the charge-discharge times.

Meanwhile, the second state of charge can be obtained by the following steps.

At step S140, a corresponding open circuit voltage (OCV) is obtained in accordance with a battery internal resistance, a battery terminal voltage, a present charge-discharge current of the battery.

Figure 2:
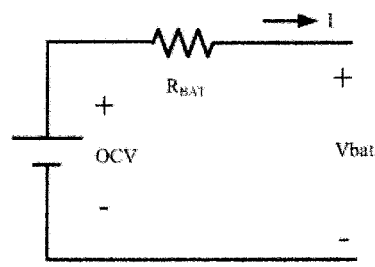
FIG. 2 is a schematic diagram of an example battery model used in an embodiment of the present disclosure.

FIG. 2 is a schematic diagram of an example battery model used in an embodiment of the present disclosure. As shown in FIG. 2, in the present embodiment, the battery is equivalent to a series circuit having an ideal power supply and a resistor. The voltage of the ideal power supply is the open circuit voltage OCV of the battery. The output voltage of the series circuit is the battery terminal voltage Vbat, the resistor is the battery internal resistance $R_{BAT}$. According to the battery model shown in FIG. 2, the open circuit voltage OCV is equal to the terminal voltage Vbat plus the voltage drop across the battery internal resistance $R_{BAT}$, that is, OCV=Vbat+I*$R_{BAT}$, where I is a current flowing through the battery, i.e., the charge-discharge current.

The calculation of the open circuit voltage needs to use the battery internal resistance $R_{BAT}$, but the battery internal resistance is related to usage frequency, the battery state of charge, the charge-discharge current, the temperature, the manufacturer and production batches, so that it is difficult to be real-time measured in application. In order to ensure accuracy, in a preferred manner of the present embodiment, the internal resistance is calculated and updated at real time based on the open circuit voltage OCV, the charge-discharge current I and the relationship between the terminal voltage Vbat and the internal resistance $R_{BAT}$. Specifically, the equation is, $$R_{BAT} = \frac{OCV - Vbat}{I}$$

The battery current I and the terminal voltage Vbat are obtained easily by measuring the battery, and the open circuit voltage OCV can be obtained by querying the corresponding curved line or table of the relationship between OCV and SOC, that is, the OCV corresponding to the chemistry state of charge is obtained according to the relationship between OCV and SOC, wherein the chemistry state of charge is the initial chemistry state of charge of the present charge process or the chemistry state of charge obtained by calculation just before the update of internal resistance.

That is, in the embodiment, the open circuit voltage OCV for updating the battery internal resistance is obtained by querying the table using the previous chemistry state of charge CSOC and after the battery internal resistance is updated, the open circuit voltage OCV for acquiring the second state of charge is calculated based on the updated battery internal resistance, the battery terminal voltage, and the present battery charge-discharge current.

It is understood that the open circuit voltage can be obtained by use of other more complex battery models, in order to improve accuracy. Correspondingly, however, this will increase difficulties on parameter extraction and computational complexity.

At step S150, the second state of charge corresponding to the present open circuit voltage of the battery is obtained based on the relationship between open circuit voltage and state of charge.

Figure 3:
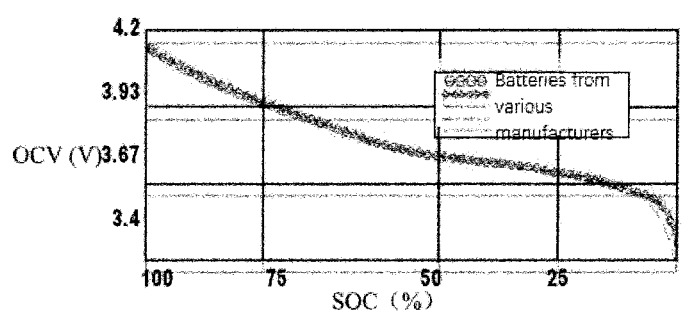
FIG. 3 is an example curved diagram of the relationship between OCV and SOC.

FIG. 3 is an example curved diagram of the relationship between OCV and SOC. As shown in FIG. 3, the open circuit voltage of the battery drops as the state of charge SOC decreases. FIG. 3 shows several curved lines of the relationship between OCV and SOC of the batteries manufactured by a plurality of different manufacturers. As shown in FIG. 3, the open circuit voltage OCV is in one-to-one correspondence with the state of charge SOC of the battery. Accordingly, the corresponding state of charge SOC can be obtained in accordance with the open circuit voltage OCV after the curved line is obtained by advance measurement, or the corresponding open circuit voltage OCV is obtained according to the chemistry state of charge CSOC, just as the previous step.

At step S200, the chemistry SOC can be obtained by weighted calculation based on the first state of charge and the second state of charge.

Alternatively, the weighted calculation may use a fixed value as a weight value.

Alternatively, due to the characteristics that the method for calculating amount of charge is more accurate in handling a large charge-discharge current and the method based on the battery model is more accurate at a small current, the weighted calculation can use weight values varying with the present charge-discharge current of the battery. Thus, the first state of charge (i.e., the state of charge obtained according to the charge calculation method) and the second state of charge (i.e., the state of charge obtained according to the model method) both vary with the current, so that their contributions to the chemistry state of charge vary accordingly, which further improves the detection accuracy of the state of charge. Specifically, the first weight value corresponding to the first state of charge decreases as the charge-discharge current decreases, and the second weight value corresponding to the second state of charge increases as the charge-discharge current decreases. For example, the weighted calculation is performed by use of the following weight values as table 1.

TABLE 1

| Battery current | Weight values of the first state of charge | Weight values of the second state of charge |
| --- | --- | --- |
| >I1 | 100% | 0% |
| I2 < I <= I1 | 70% | 30% |
| I3 < I <= I2 | 50% | 50% |
| I4 < I <= I3 | 0% | 70% |
| I <= I4 | 0% | 100% |

I1-I4 are different threshold values for the current, I1<I2<I3<I4. In the present embodiment, these threshold values may be set according to different kinds of batteries and application scenarios. It is easy to understand that the weight values corresponding to the first state of charge and the second state of charge are not limited to those values shown in the table and can be adjusted according to the actual situation.

In summary, the disclosure obtains the first state of charge and the second state of charge of the battery by use of the charge calculation method and the method based on battery model, respectively. The charge calculation method is more accurate when the charge-discharge current is large and the method based on battery model is better in handling a small current, so that the chemistry state of charge obtained by weighted calculation based on the first state of charge and the second state of charge can represent the real state of charge more precisely.

At least one of the following parameters representing the states of battery can be calculated after the chemistry state of charge with high precision is obtained: the residual charge (RM), the relative state of charge (RSOC) and the battery remaining usable time (time-to-empty, TTE).

The residual charge RM, which is the total remaining amount of charge that can be released in the battery, can be calculated based on the present chemistry state of charge, the minimum chemistry state of charge and the present maximum charge amount, specifically by the following equation:

$$RM = (CSOC - CSOC_{min})Q_{max}$$

$CSOC_{min}$ is the minimum chemistry state of charge which is the state of charge when the battery ends the release of charge, and it can be a predetermined value or calculated based on the battery internal resistance and charge-discharge current.

In actual application, because the battery internal resistance exists, different discharge current will release different amounts of charge. When the current is large, the voltage drop across the battery internal resistance is also large, then the battery terminal voltage will quickly reach a protection voltage of the battery. When the current is small, the voltage drop across the battery resistance is also small and the battery terminal voltage will reach the protection voltage of the battery slower, and the battery can release more amount of charge. So a concept of a relative state of charge is introduced as RSOC. RSOC represents a percentage of the available charge of the battery at the present discharge current.

The relative state of charge RSOC can be calculated based on the remaining charge amount, the maximum chemistry state of charge, the minimum chemistry state of charge and the present maximum charge amount. In particular, it can be calculated based on the following equation:

$$RSOC = \frac{RM}{(CSOC_{max} - CSOC_{min}) * Q_{max}}$$

$CSOC_{max}$ is the maximum chemistry state of charge, i.e., the chemistry state of charge at the time when the battery stops charging. It is updated continuously in actual application and it may be updated continuously by detecting the state of charge of the battery.

The remaining usable time of the battery TTE is also one of the parameters that represent the state of the battery, it can be obtained by the residual charge RM and the average value $I_{AVG}$ of the charge-discharge current. Specifically, it is obtained by the following equation:

$$TTE = \frac{RM}{I_{AVG}},$$

wherein the average value $I_{AVG}$ of the charge-discharge current can be obtained by various manners, it may be an average value of the current for a specific time period, or an average value of the current over the entire charge and discharge cycle, or obtained by using other specific manners.

Figure 4:
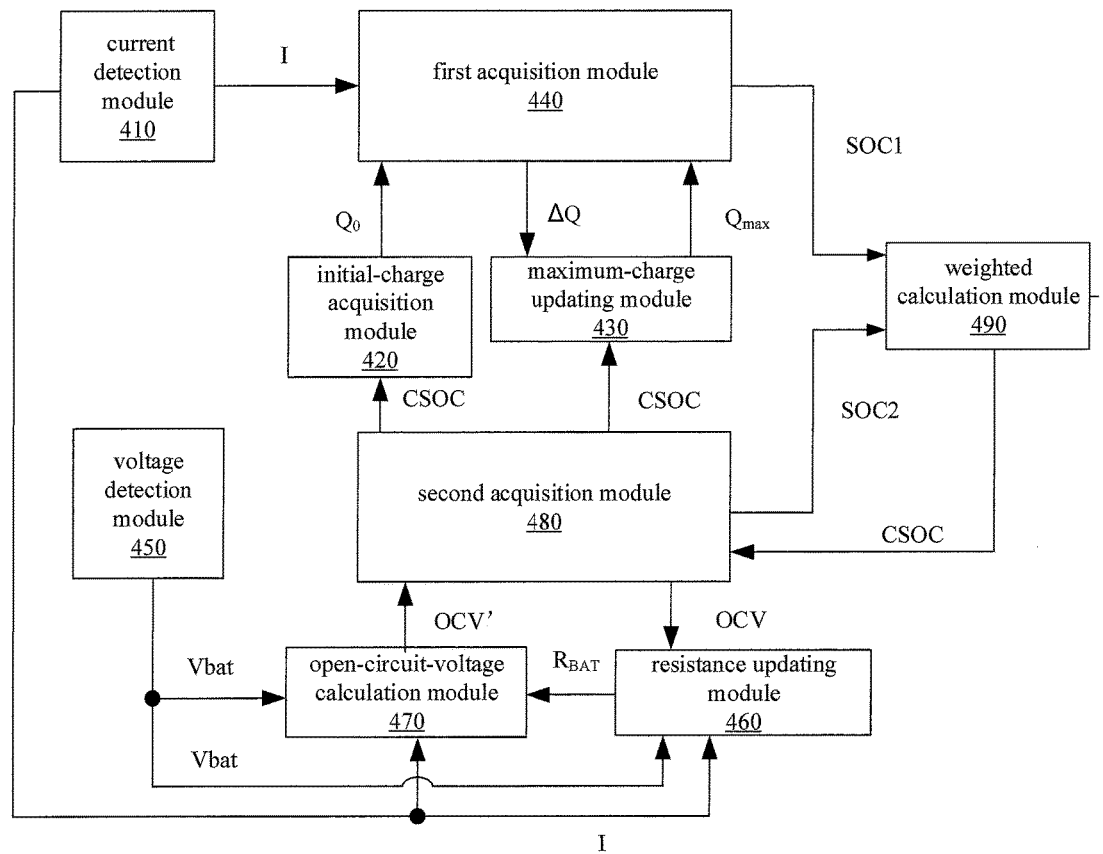
FIG. 4 is a signal flow diagram of a preferred embodiment of a method for detecting a state of a battery according to an embodiment of the present disclosure.

FIG. 4 is a signal flow diagram of a preferred embodiment of a method for detecting a state of a battery according to an embodiment of the present disclosure. As shown in FIG. 4, the current detection module 410 detects the charge-discharge current I of the battery. An initial-charge acquisition module 420 calculates the initial charge amount $Q_0$ of the present charge-discharge process based on the real-time feedback of the chemistry state of charge CSOC. A maximum-charge updating module 430 acquires the changing value of the state of charge according to the feedback of the state of charge and obtains the present maximum charge amount Qmax combining with the changing value of the charge amount previously recorded. A first acquisition module 440 calculates a first state of charge SOC1 in accordance with the charge-discharge current I, the updated initial charge amount $Q_0$ and the present maximum charge amount Qmax by use of the charge calculation method. A voltage detection module 450 detects and obtains the battery terminal voltage Vbat. The resistance updating module 460 obtains an updated battery internal resistance $R_{BAT}$ in accordance with the charge-discharge current I, the battery terminal voltage Vbat and the corresponding open circuit voltage OCV obtained based on the chemistry state of charge CSOC. An open-circuit-voltage calculation module 470 calculates the open circuit voltage OCV' of the battery in accordance with the updated battery internal resistance $R_{BAT}$, the charge-discharge current I and the battery terminal voltage Vbat. A second acquisition module 480 obtains a corresponding second state of charge SOC2 in accordance with the open circuit OCV'. The weighted calculation module 490 performs weighted calculation to obtain the chemistry state of charge CSOC based on predetermined weight values for the first state of charge SOC1 and the second state of charge SOC2, wherein the predetermined weight values are selected in accordance with the charge-discharge current I.

As a result, the disclosure settles the difficulty on parameter extraction of the conventional model method, eliminates the influence of the accumulated error of the charge calculation method, and combines the advantages of the method based on the battery model and the coulometer method.

Meanwhile, the present disclosure is not limited to the detection of one single battery but can also be performed for the detection of a battery pack which has a plurality of batteries being coupled in series or in parallel.

Figure 5:
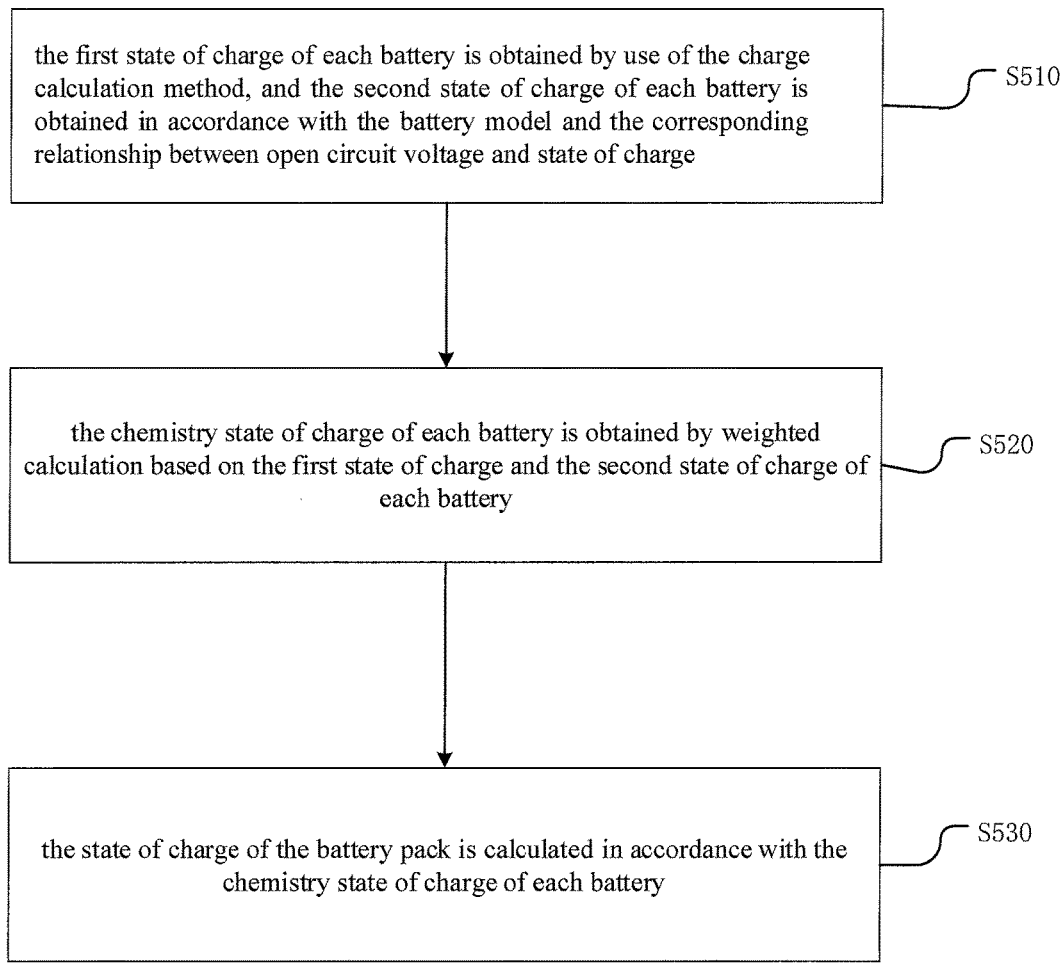
FIG. 5 is a flow diagram of an example method for detecting a state of a battery pack according to an embodiment of the present disclosure.

FIG. 5 is a flow diagram of an example method for detecting a state of a battery pack. As shown in FIG. 5, the method comprises the following steps:

At step S510, the first state of charge of each battery is obtained by use of the charge calculation method, and the second state of charge of each battery is obtained in accordance with the battery model and the corresponding relationship between open circuit voltage and state of charge.

At step S520, the chemistry state of charge of each battery is obtained by weighted calculation based on the first state of charge and the second state of charge of each battery.

At steps S510 and S520, each battery is detected respectively, and then the chemistry state of charge, which can represents the state of charge of each battery precisely, is obtained by weighted calculation performed for each battery. It is easy to be understood that at the steps S510 and S520, the first state of charge and the second state of charge are obtained following the same steps as in the previous embodiment. Meanwhile, in order to ensure the accuracy of the detection, the update of the maximum charge amount and the updating calculation of the battery internal resistance can be performed as necessary.

At step S530, the state of charge of the battery pack is calculated in accordance with the chemistry state of charge of each battery.

At step S530, the state of charge of all the batteries is aggregated, for example, if the capacity of each battery in the battery pack are the same, the state of charge of the battery pack can be obtained by averaging.

Thus, the state of the battery pack can be detected precisely.

It is easy to be understood that the residual charge RM, the relative state of charge RSOC and the battery remaining usable time TTE can be calculated based on the obtained state of charge of the battery pack.

Figure 6:
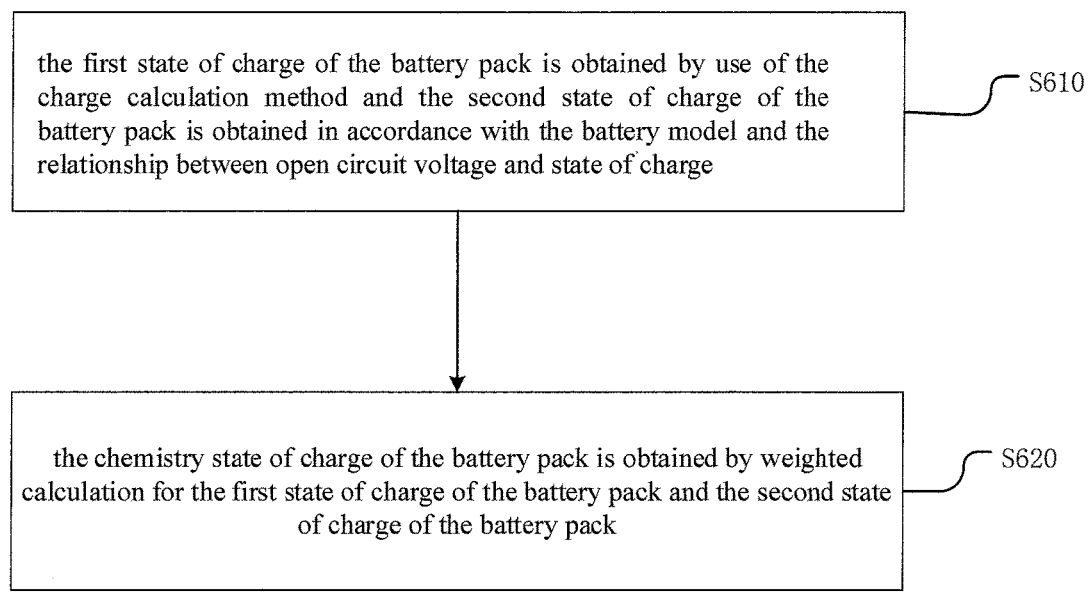
FIG. 6 is a flow diagram of another example method for detecting a state of a battery pack according to an embodiment of the present disclosure.

FIG. 6 is a flow diagram of another example method for state detection of a battery pack. As shown in FIG. 6, the method comprises the following steps.

At step S610, the first state of charge of the battery pack is obtained by use of the charge calculation method and the second state of charge of the battery pack is obtained in accordance with the battery model and the relationship between open circuit voltage and state of charge. The open circuit voltage is calculated by averaging the terminal voltages for batteries in the battery pack.

At step S620, the chemistry state of charge of the battery pack is obtained by weighted calculation for the first state of charge of the battery pack and the second state of charge of the battery pack.

Unlike the method shown in FIG. 5, the present embodiment detects the entire battery pack as a single battery. The second state of charge is obtained in accordance with an average terminal voltage which is obtained by averaging the battery terminal voltages of the batteries in series in the battery pack. Thus, the workload of calculation and detection can be reduced and the state of charge of the entire battery pack will be obtained directly.

It is easy to be understood that the residual charge RM, the relative state of charge RSOC and the battery remaining usable time TTE can be calculated based on the obtained state of charge of the battery pack.

The foregoing descriptions of specific embodiments of the present invention have been presented, but are not intended to limit the invention to the precise forms disclosed. It will be readily apparent to one skilled in the art that many modifications and changes may be made in the present invention. Any modifications, equivalence, variations of the preferred embodiments can be made without departing from the doctrine and spirit of the present invention.

The invention claimed is:

1. A method for detecting a state of a battery, comprising:
obtaining a first state of charge by use of a charge calculation method, and obtaining a second state of charge in accordance with a battery model and a relationship between an open circuit voltage and said state of charge;
performing a weighted calculation for said first state of charge and said second state of charge to obtain a chemistry state of charge; and
obtaining a residual charge in accordance with a present chemistry state of charge, a minimum chemistry state of charge and a present maximum charge amount.

2. The method for detecting said state of said battery according to claim 1, wherein weight values used in said weighted calculation vary with a present charge-discharge current of said battery.

3. The method for detecting said state of said battery according to claim 2, wherein a first weight value corresponding to said first state of charge decreases as said charge-discharge current decreases, and a second weight value corresponding to said second state of charge increases as said charge-discharge current decreases.

4. The method for detecting said state of said battery according to claim 1, wherein obtaining a first state of charge by use of a charge calculation method comprises:
detecting a charge-discharge current and a charge-discharge duration time of said battery;
obtaining said present maximum charge amount and an initial charge amount of present charge-discharge process; and
calculating said first state of charge in accordance with said maximum charge amount, said initial charge amount of present charge-discharge process, said charge-discharge current and said charge-discharge duration time of said battery.

5. The method for detecting said state of said battery according to claim 4, wherein said present maximum charge amount is obtained by updating a changing value of a charge amount and a changing value of a state of charge in a previous charge-discharge process, said changing value of said state of charge is a changing value in said previous charge-discharge process of said first state of charge or of said second state of charge or of said chemistry state of charge.

6. The method for detecting said state of said battery according to claim 5, wherein said present maximum charge amount is updated in a case that said changing value of said state of charge in a charge process or in a discharge process is greater than a predetermined threshold value, or,
said present maximum charge amount is updated in a case that said changing value of said state of charge accumulated in a plurality of charge processes is greater than a predetermined threshold value or in a case that said changing value of said state of charge accumulated in a plurality of discharge processes is greater than a predetermined threshold value.

7. The method for detecting said state of said battery according to claim 4, wherein said initial charge amount of present charge-discharge process is calculated based on said present maximum charge amount and said initial state of charge of present charge-discharge process, and said initial state of charge of present charge-discharge process is said first state of charge or said second state of charge or said chemistry state of charge obtained after previous charge-discharge process.

8. The method for detecting said state of said battery according to claim 1, wherein said step of obtaining a second state of charge in accordance with a battery model and a relationship between open circuit voltage and state of charge comprises:
obtaining a present open circuit voltage (OCV) of said battery in accordance with a battery internal resistance, a battery terminal voltage and a present charge-discharge current of said battery, based on said battery model, and
obtaining said second state of charge corresponding to said present open circuit voltage of said battery based on said relationship between open circuit voltage and state of charge.

9. The method for detecting said state of said battery according to claim 1, wherein said battery internal resistance is updated periodically in accordance with an estimated open circuit voltage of said battery, said battery terminal voltage and said present charge-discharge current of said battery, said estimated battery open circuit voltage is obtained based on said relationship between open circuit voltage and state of charge, which corresponds to said present chemistry state of charge.

10. The method for detecting said state of said battery according to claim 1, further comprising:
calculating at least one of said following battery state parameters in accordance with said chemistry state of charge: a relative state of charge (RSOC) and a remaining usable time (TTE) of said battery.

11. A method for detecting a state of a battery pack, wherein said battery pack comprises at least two batteries being coupled in series or in parallel, said method comprises:
obtaining a first state of charge of each battery by use of a charge calculation method, and obtaining a second state of charge of each battery in accordance with a battery model and a relationship between open circuit voltage and state of charge; and performing a weighted calculation for said first state of charge and said second state of charge of each battery to obtain a chemistry state of charge of each battery;

calculating a chemistry state of charge of said battery pack in accordance with said chemistry state of charge of each battery; and obtaining a residual charge in accordance with a present chemistry state of charge, a minimum chemistry state of charge and a present maximum charge amount.

12. A method for detecting a state of a battery pack, wherein said battery pack comprises at least two batteries being coupled in series or in parallel, said method comprises:

obtaining a first state of charge of said battery pack by use of a charge calculation method, and obtaining a second state of charge of said battery pack in accordance with a battery model and a relationship between open circuit voltage and state of charge; wherein an average terminal voltage of said batteries in said battery pack is used for calculating an open circuit voltage of a battery;

performing a weighted calculation for said first state of charge of said battery pack and said second state of charge of said battery pack to obtain a chemistry state of charge of said battery pack; and obtaining a residual charge in accordance with a present chemistry state of charge, a minimum chemistry state of charge and a present maximum charge amount.

13. A device for detecting a state of a battery or a battery pack, comprising: a processor for performing said method according to claim 1.

* * * * *